(12) United States Patent
Kawata et al.

(10) Patent No.: US 10,675,851 B2
(45) Date of Patent: Jun. 9, 2020

(54) METHOD OF MANUFACTURING DISPLAY DEVICE

(71) Applicant: Japan Display Inc., Minato-ku (JP)

(72) Inventors: Yasushi Kawata, Tokyo (JP); Akio Murayama, Tokyo (JP)

(73) Assignee: Japan Display Inc., Minato-ku (JP)

( * ) Notice: Subject to any disclaimer, the term of this patent is extended or adjusted under 35 U.S.C. 154(b) by 227 days.

(21) Appl. No.: 15/446,615

(22) Filed: Mar. 1, 2017

(65) Prior Publication Data

US 2017/0173936 A1 Jun. 22, 2017

Related U.S. Application Data

(63) Continuation of application No. 14/139,997, filed on Dec. 24, 2013, now Pat. No. 9,630,389.

(30) Foreign Application Priority Data

Jan. 8, 2013 (JP) .................................. 2013-000936
Nov. 13, 2013 (JP) .................................. 2013-235225

(51) Int. Cl.
*B32B 38/10* (2006.01)
*B23K 26/18* (2006.01)
(Continued)

(52) U.S. Cl.
CPC .......... *B32B 38/10* (2013.01); *B23K 26/0006* (2013.01); *B23K 26/18* (2013.01);
(Continued)

(58) Field of Classification Search
USPC .............................................. 156/712, 275.5
See application file for complete search history.

(56) References Cited

U.S. PATENT DOCUMENTS 5,576,868 A * 11/1996 Togashi .............. G02F 1/13452
349/143
2009/0103010 A1* 4/2009 Okamoto .......... G02F 1/133305
349/73

(Continued)

FOREIGN PATENT DOCUMENTS

JP        2004-191573 A    7/2004
JP        2006-49800 A     2/2006

(Continued)

OTHER PUBLICATIONS

Office Action dated May 29, 2018 in Japanese Patent Application No. 2017-151809, with English translation citing documents AJ, AK, AL, AM, AN, AO, AP, AQ, AR, AS, AT, AU, and AV therein, 10 pages.

*Primary Examiner* — Michael N Orlando
*Assistant Examiner* — Elizabeth Bradford
(74) *Attorney, Agent, or Firm* — Oblon, McClelland, Maier & Neustadt, L.L.P.

(57) ABSTRACT

According to one embodiment, a method of manufacturing a display device, includes preparing a first substrate in which a first display element part, a first extension part, a second display element part, and a second extension part, are formed, preparing a second substrate in which a first peeling auxiliary layer, a second peeling auxiliary layer, a sacrifice layer, a first color filter layer, and a second color filter layer, are formed, attaching the first substrate and the second substrate, and radiating a laser beam on the second substrate, and peeling a second support substrate from the first peeling auxiliary layer and the second peeling auxiliary layer while blocking the laser beam by the sacrifice layer.

4 Claims, 8 Drawing Sheets

(51) Int. Cl.
     *B23K 26/40*      (2014.01)
     *G02F 1/1333*     (2006.01)
     *H01L 27/32*      (2006.01)
     *B23K 26/57*      (2014.01)
     *B23K 26/00*      (2014.01)
     *B32B 27/28*      (2006.01)
     *B23K 103/16*         (2006.01)
     *G02F 1/136*          (2006.01)
     *H01L 51/52*          (2006.01)
     *G02F 1/1368*         (2006.01)
     *H01L 51/56*          (2006.01)

(52) U.S. Cl.
     CPC .............. *B23K 26/40* (2013.01); *B23K 26/57* (2015.10); *B32B 27/281* (2013.01); *G02F 1/133351* (2013.01); *H01L 27/3276* (2013.01); *B23K 2103/172* (2018.08); *B32B 2457/206* (2013.01); *G02F 1/1333* (2013.01); *G02F 1/1368* (2013.01); *G02F 2001/13613* (2013.01); *G02F 2201/121* (2013.01); *G02F 2201/123* (2013.01); *H01L 27/322* (2013.01); *H01L 27/3272* (2013.01); *H01L 51/5284* (2013.01); *H01L 51/56* (2013.01); *H01L 2227/323* (2013.01); *H01L 2227/326* (2013.01); *H01L 2251/566* (2013.01)

(56) References Cited

U.S. PATENT DOCUMENTS

| 2010/0134407 | A1* | 6/2010 | Wang ...................... G02F 1/167 345/107 |
| 2011/0092004 | A1  | 4/2011 | Kim et al. |
| 2011/0147747 | A1* | 6/2011 | Jeon ..................... H01L 27/1218 257/59 |
| 2012/0099056 | A1  | 4/2012 | Lee et al. |
| 2014/0190621 | A1  | 7/2014 | Kawata et al. |

FOREIGN PATENT DOCUMENTS

| JP | 2009-3020    A | 1/2009 |
| JP | 2009-98425   A | 5/2009 |
| JP | 2010-507829  A | 3/2010 |
| JP | 2012-027177  A | 2/2012 |

\* cited by examiner

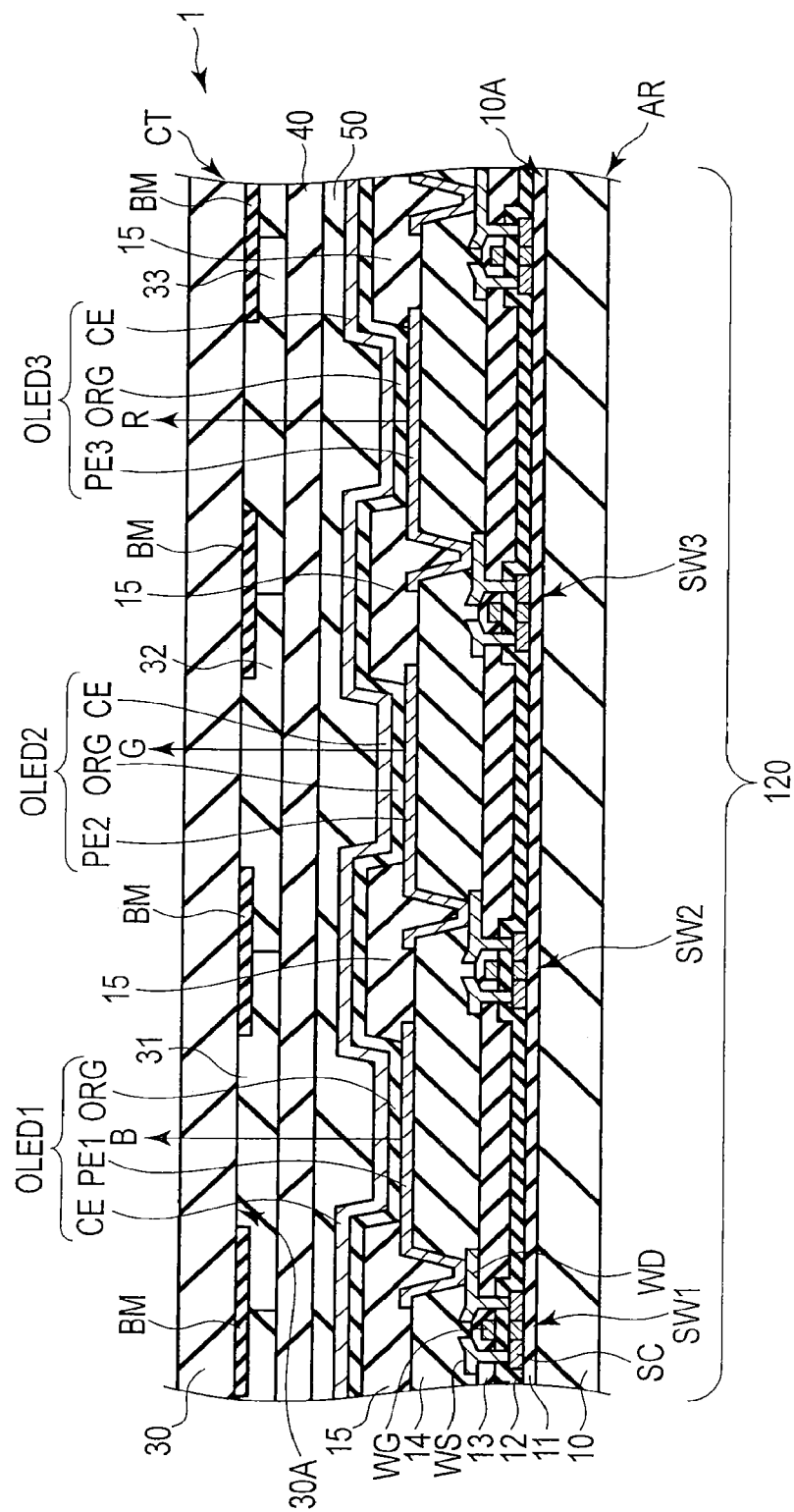
F I G. 1A

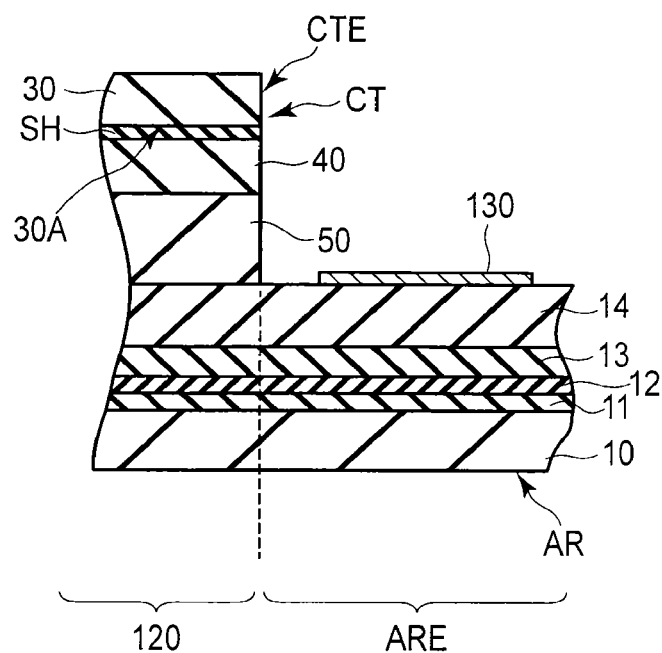
F I G. 1B
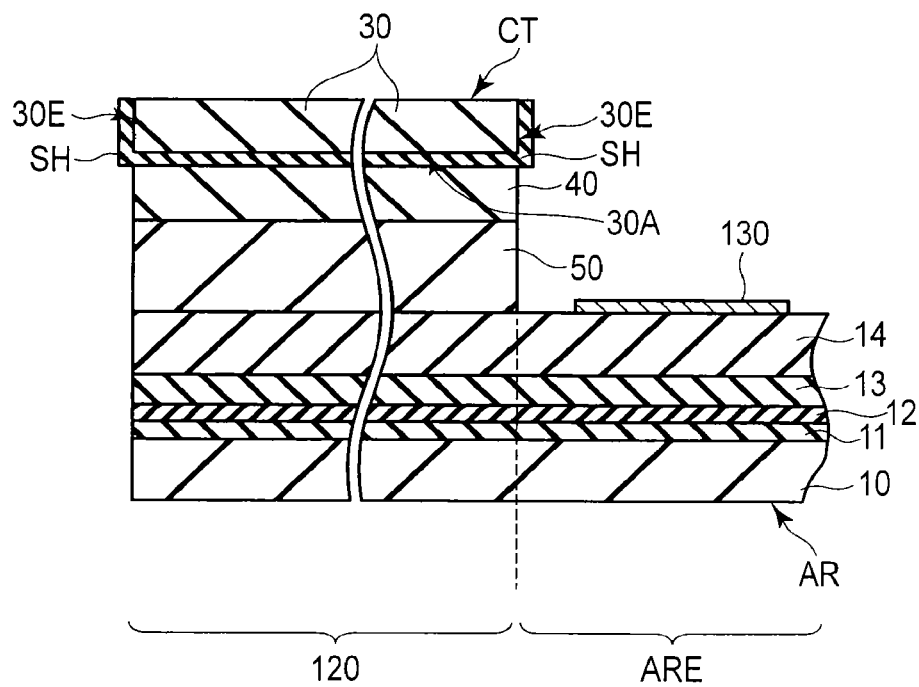
F I G. 1C

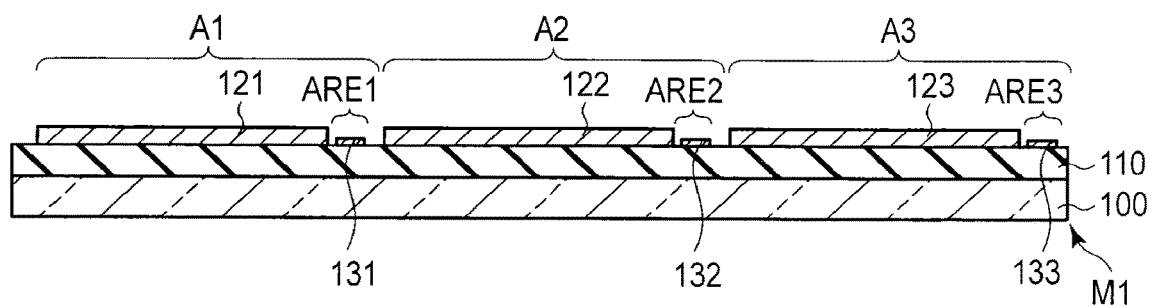
F I G. 2
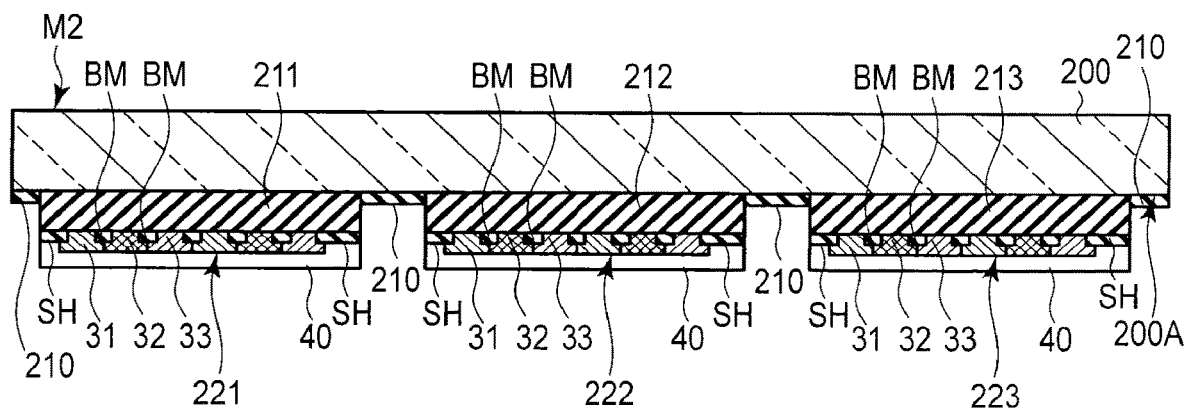
F I G. 3

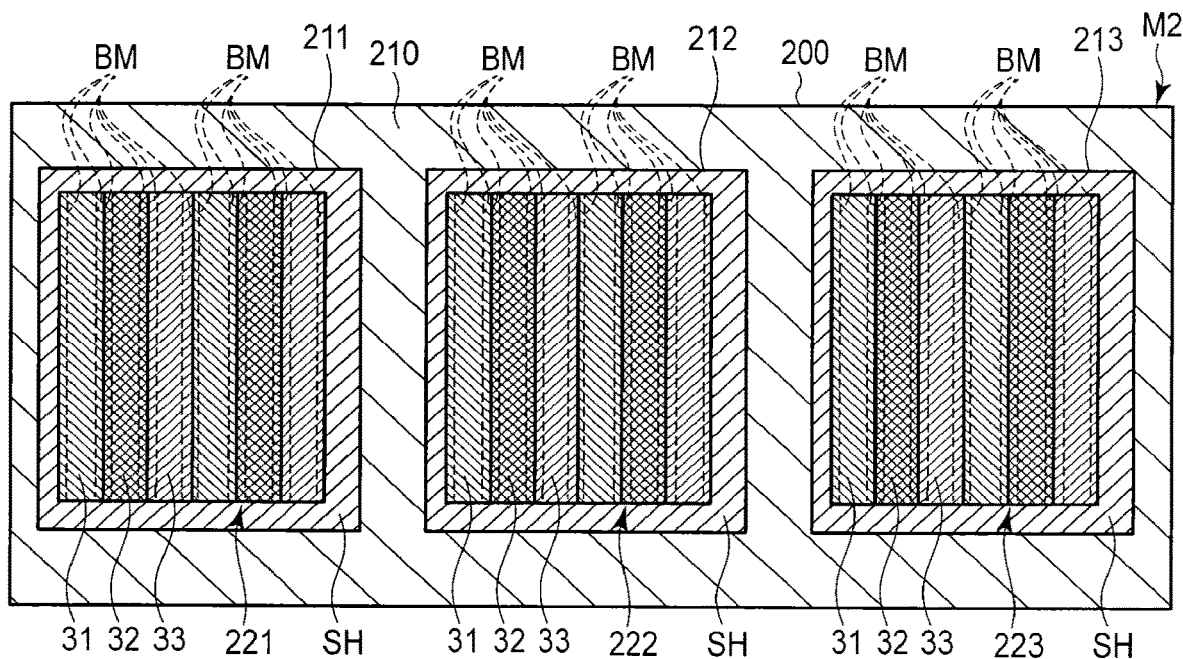
F I G. 4
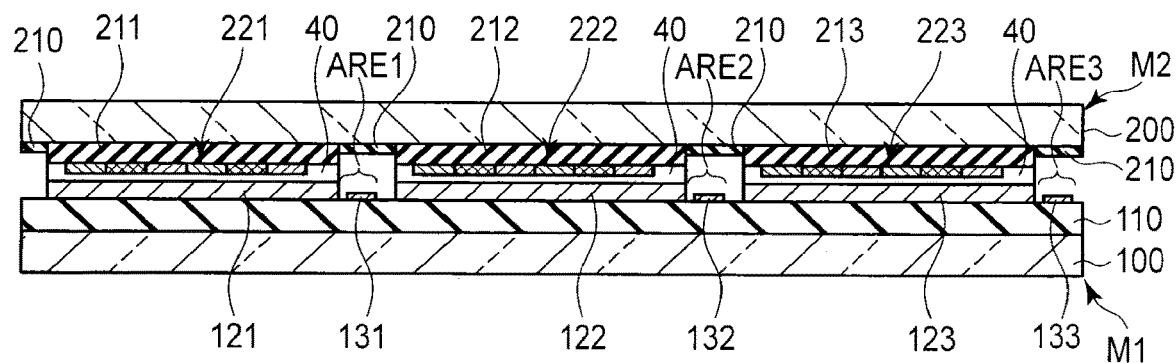
F I G. 5

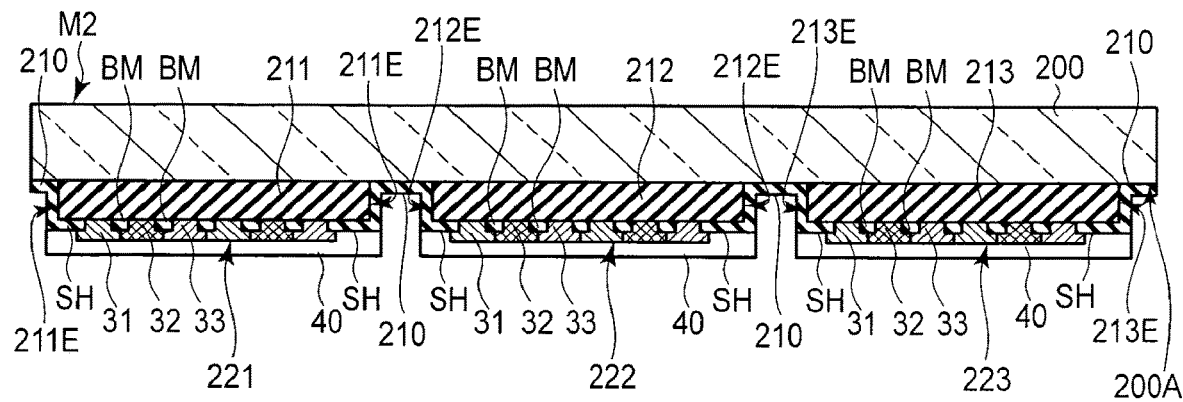
F I G. 14
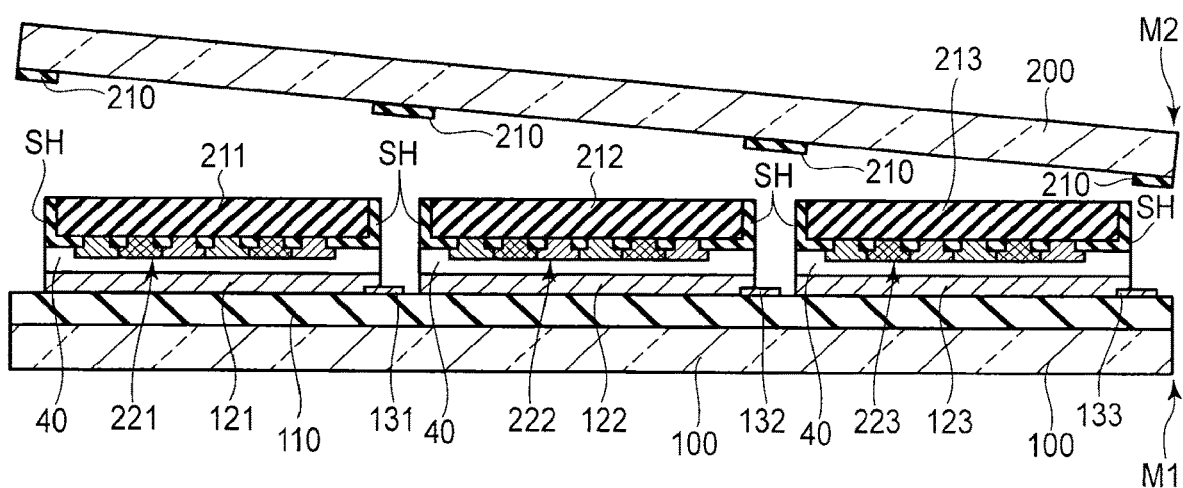
F I G. 15

METHOD OF MANUFACTURING DISPLAY DEVICE

CROSS-REFERENCE TO RELATED APPLICATIONS

This application is a continuation of U.S. application Ser. No. 14/139,997 filed Dec. 24, 2013, and is based upon and claims the benefit of priority from Japanese Patent Applications No. 2013-000936, filed Jan. 8, 2013; and No. 2013-235225, filed Nov. 13, 2013, the entire contents of all of which are incorporated herein by reference.

FIELD

Embodiments described herein relate generally to a method of manufacturing a display device.

BACKGROUND

Flat-panel display devices, such as an organic electroluminescence (EL) display device and a liquid crystal display device, have been used in various fields. In recent years, as regards mobile information terminal devices such as mobile phones and PDAs (personal digital assistants), there has been an increasing demand for a display device having a less thickness and a less weight. For example, as a method of realizing a less thickness and less weight, there is a technique wherein a glass substrate is replaced with a resin layer of, e.g. polyimide with a relatively high heat resistance, and the resin layer is formed on a glass substrate. After TFTs, etc. are formed on the resin layer, the resultant structure is divided into cells, and the resin layer is finally peeled from the glass substrate. Thus, a sheet display is manufactured.

In this process, however, when many panels are assembled batchwise by using mother glass substrates and then the assembled body is separated into individual panels, it is necessary to cut the resin layer together with both attached mother glass substrates, and this makes it difficult to take out electrodes for mounting signal supply sources which are necessary for displaying images on the panels. This being the case, there has been a demand for an improvement in productivity.

BRIEF DESCRIPTION OF THE DRAWINGS

FIG. 1A is a view which schematically illustrates a cross-sectional structure including a display element part 120 of a display device 1 according to an embodiment.

FIG. 1B is a view which schematically illustrates a cross-sectional structure including an extension part ARE of the display device 1 of the embodiment.

FIG. 1C is a view which schematically illustrates another cross-sectional structure including the extension part ARE of the display device 1 of the embodiment.

FIG. 2 is a view for describing a method of manufacturing the display device 1 of the embodiment, FIG. 2 illustrating a step of preparing a first mother substrate M1.

FIG. 3 is a view for describing the method of manufacturing the display device 1 of the embodiment, FIG. 3 illustrating a step of preparing a second mother substrate M2.

FIG. 4 is a schematic plan view of the second mother substrate M2 shown in FIG. 3.

FIG. 5 is a view for describing the method of manufacturing the display device 1 of the embodiment, FIG. 5 illustrating a step of attaching the first mother substrate M1 and the second mother substrate M2.

FIG. 14 is a view for describing another method of manufacturing the display device 1 of the embodiment, FIG. 14 illustrating a step of preparing a second mother substrate M2.

FIG. 15 is a view for describing the another method of manufacturing the display device 1 of the embodiment, FIG. 15 illustrating a step of peeling a support substrate 200 of the second mother substrate M2.

DETAILED DESCRIPTION

Figure 6:
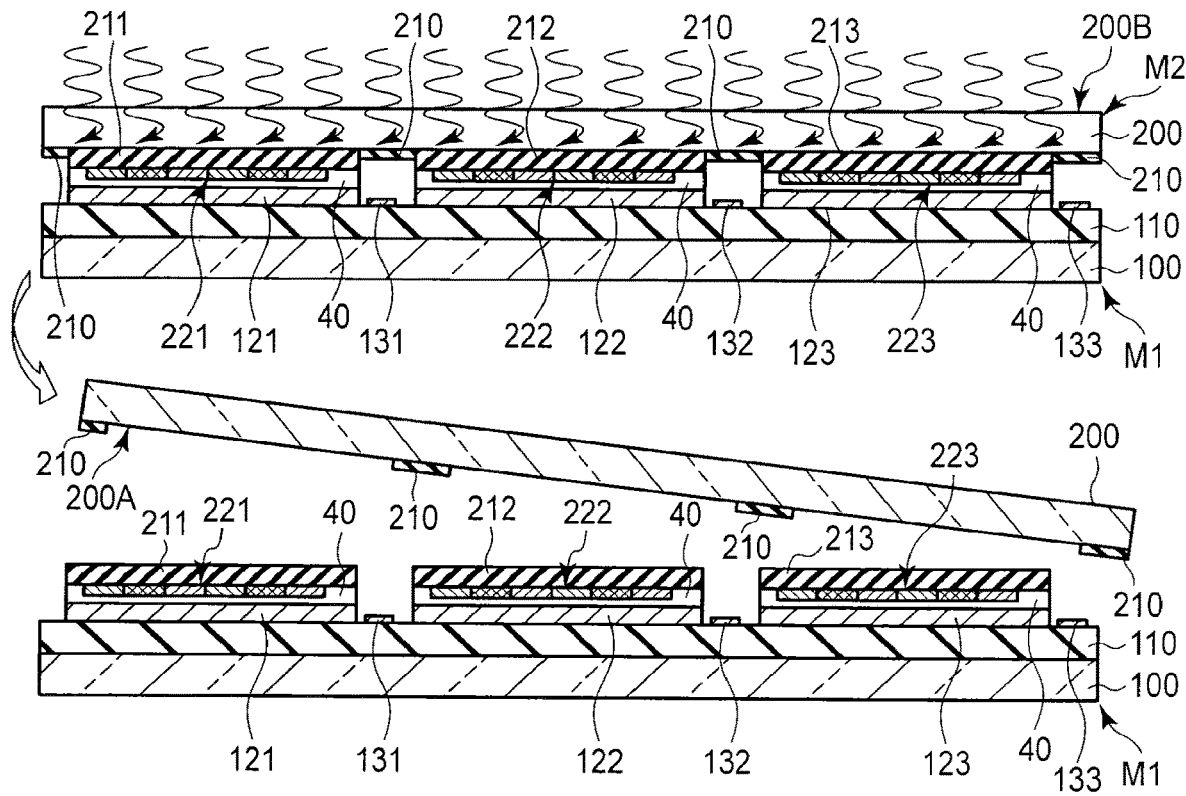
FIG. 6 is a view for describing the method of manufacturing the display device 1 of the embodiment, FIG. 6 illustrating a step of peeling a support substrate 200 of the second mother substrate M2.

In general, according to one embodiment, a method of manufacturing a display device, includes: preparing a first substrate in which a first display element part including a first display element, a first extension part including a first mounting portion, a second display element part including a second display element, and a second extension part including a second mounting portion are formed, the first display element part and the first extension part being located in a first region above a first support substrate, and the second display element part and the second extension part being located in a second region neighboring the first region above the first support substrate; preparing a second substrate in which a first peeling auxiliary layer opposed to the first display element part, a second peeling auxiliary layer opposed to the second display element part and spaced apart from the first peeling auxiliary layer, a sacrifice layer opposed to the first extension part and the second extension part, a first color filter layer located above the first peeling auxiliary layer, and a second color filter layer located above the second peeling auxiliary layer, are formed, the first peeling auxiliary layer, the second peeling auxiliary layer, the sacrifice layer, the first color filter layer, and the second color filter layer being located above a second support substrate; attaching the first substrate and the second substrate in a state in which the first extension part and the second extension part are opposed to the sacrifice layer, the first display element part being attached to the first color filter layer, and the second display element part being attached to the second color filter layer; and radiating a laser beam on the second substrate, and peeling the second support substrate from the first peeling auxiliary layer and the second peeling auxiliary layer while blocking the laser beam by the sacrifice layer.

Embodiments will now be described in detail with reference to the accompanying drawings. The disclosure is merely an example, and proper modifications within the spirit of the invention, which are easily conceivable by a skilled person, are included in the scope of the invention as a matter of course. In the drawings, in some cases, widths, thicknesses, shapes, etc. of respective parts are represented schematically, compared to actual configurations, in order to make the description clearer, but the schematic representation is merely an example and does not restrict the interpretation of the invention. In addition, in the specification and drawings, structural elements having the functions, which are identical or similar to the functions described in preceding drawings, are denoted by like reference numerals, and an overlapping detailed description may be omitted unless otherwise necessary.

FIG. 1A is a view which schematically illustrates a cross-sectional structure including a display element part 120 of a display device 1 according to the embodiment. A description is given of an organic EL display device as an example of the sheet-shaped display device 1.

The illustrated display device 1 adopts an active matrix driving method, and includes an array substrate AR and a counter-substrate CT. The array substrate AR is formed by using a first insulative substrate 10. The array substrate AR includes switching elements SW1 to SW3 and organic EL elements OLED1 to OLED3 on an inner surface 10A side of the first insulative substrate 10.

The first insulative substrate 10 is a resin substrate, which is formed of, for example, a material consisting mainly of polyimide (PI). The first insulative substrate 10 has a thickness of, e.g. 5 to 30 μm. It is preferable to use, as the material of the first insulative substrate 10, a material with a high heat resistance, such as polyimide, polyamide-imide, or polyaramide. Incidentally, the first insulative substrate 10 may be transparent or opaque.

The inner surface 10A of the first insulative substrate 10 is covered with a first insulation film 11. The first insulation film 11 functions as an inner surface barrier film for suppressing entrance of ionic impurities from the first insulative substrate 10 or entrance of moisture via the first insulative substrate 10. The first insulation film 11 is formed of an inorganic material such as silicon nitride (SiN), silicon oxide (SiO) or silicon oxynitride (SiON), and is composed of a single layer or a multilayer. Incidentally, the first insulation film 11 may be formed of some other material which has a barrier capability and can ensure transparency. In addition, when another insulation film, which is located on the inner surface 10A side of the first insulative substrate 10, functions as a barrier film, the first insulation film 11 may be omitted.

The switching elements SW1 to SW3 are formed on the first insulation film 11. These switching elements SW1 to SW3 are, for example, thin-film transistors (TFTs) each including a semiconductor layer SC. The switching elements SW1 to SW3 have the same structure. In the description below, attention is paid to the switching element SW1, and the structure thereof is described more specifically.

In the example illustrated, the switching element SW1 may be of a top gate type or a bottom gate type. The semiconductor layer SC may be, for example, amorphous silicon or polysilicon, or may be an oxide semiconductor formed of an oxide including at least one of indium (In), gallium (Ga) and zinc (Zn). The oxide semiconductor can be formed in a process at lower temperatures than the amorphous silicon or polysilicon. In particular, an oxide semiconductor, such as IGZO, is preferable in that the investment cost of manufacturing equipment can be reduced since a manufacturing apparatus, which is used for fabricating thin-film transistors including amorphous silicon semiconductor layers, can also be used as such.

The semiconductor layer SC is formed on the first insulation film 11, and is covered with a second insulation film 12. The second insulation film 12 is also disposed on the first insulation film 11. A gate electrode WG of the switching element SW1 is formed on the second insulation film 12. The gate electrode WG is covered with a third insulation film 13. The third insulation film 13 is also disposed on the second insulation film 12.

A source electrode WS and a drain electrode WD of the switching element SW1 are formed on the third insulation film 13. The source electrode WS and drain electrode WD are put in contact with the semiconductor layer SC. The source electrode WS and drain electrode WD are covered with a fourth insulation film 14. The fourth insulation film 14 is also disposed on the third insulation film 13.

The organic EL elements OLED1 to OLED3 are formed on the fourth insulation film 14. In the example illustrated, the organic EL element OLED1 is electrically connected to the switching element SW1, the organic EL element OLED2 is electrically connected to the switching element SW2, and the organic EL element OLED3 is electrically connected to the switching element SW3.

The color of emission light of each of the organic EL elements OLED1 to OLED3 is white. In addition, each of the organic EL elements OLED1 to OLED3 is configured as a top emission type which emits light toward the counter-substrate CT. The organic EL elements OLED1 to OLED3 have the same structure.

The organic EL element OLED1 includes an anode PE1 which is formed on the fourth insulation film 14. The anode PE1 is in contact with the drain electrode WD of the switching element SW1 and is electrically connected to the switching element SW1. Similarly, the organic EL element OLED2 includes an anode PE2 which is electrically connected to the switching element SW2, and the organic EL element OLED3 includes an anode PE3 which is electrically connected to the switching element SW3. The anodes PE1 to PE3 may be formed of a transparent, electrically conducive material such as indium tin oxide (ITO) or indium zinc oxide (IZO), or may be formed of a metallic material such as aluminum (Al), magnesium (Mg), silver (Ag), titanium (Ti), or an alloy thereof. In the case of the top emission type, it is desirable that the anodes PE1 to PE3 be formed of a metallic material with a high reflectivity.

The organic EL elements OLED1 to OLED3 further include an organic light emission layer ORG and a cathode CE. The organic light emission layer ORG is located on the anodes PE1 to PE3. The organic light emission layer ORG is continuously formed, without a break, over the organic EL elements OLED1 to OLED3. The cathode CE is located on the organic light emission layer ORG. In addition, the cathode CE is continuously formed, without a break, over the organic EL elements OLED1 to OLED3. The cathode CE is formed of, for example, a transparent, electrically conductive material such as ITO or IZO.

Specifically, the organic EL element OLED1 is composed of the anode PE1, organic light emission layer ORG and cathode CE. Similarly, the organic EL element OLED2 is composed of the anode PE2, organic light emission layer ORG and cathode CE, and the organic EL element OLED3 is composed of the anode PE3, organic light emission layer ORG and cathode CE. In the meantime, in the organic EL elements OLED1 to OLED3, a hole injection layer or a hole transport layer may be further provided between each of the anodes PE1 to PE3 and the organic light emission layer ORG, and an electron injection layer or an electron transport layer may be further provided between the organic light emission layer ORG and the cathode CE.

In the example illustrated, the organic EL elements OLED1 to OLED3 are partitioned by ribs 15. The ribs 15 are formed on the fourth insulation film 14 and cover the edges of the anodes PE1 to PE3. Although not described in detail, the ribs 15 are formed, for example, in a grid shape or in a stripe shape on the fourth insulation film 14. The ribs 15 are covered with the organic light emission layer ORG. Specifically, the organic light emission layer ORG extends over not only the anodes PE1 to PE3 but also over the ribs 15.

In addition, in the example illustrated, the organic EL elements OLED1 to OLED3 are sealed by a transparent sealing film 50. The sealing film 50 is configured such that at least a surface thereof is covered with a transparent inorganic material (e.g. silicon nitride or silicon oxide). For example, the sealing film 50 may be a single-layer structure of a thin film formed of an inorganic material, may be a multilayer structure of thin films formed of an inorganic material, or may be a multilayer structure in which an inorganic film formed of an inorganic material and an organic film formed of an organic material are alternately stacked. The sealing film 50 functions as a barrier film which protects the organic EL elements OLED1 to OLED3 from contaminants such as moisture, oxygen and hydrogen.

A display element part 120 corresponds to that region of the array substrate AR, where the plural organic EL elements OLED are arranged, and is substantially a display region which displays an image.

The counter-substrate CT is formed by using a transparent second insulative substrate 30. The counter-substrate CT includes a black matrix BM, a first color filter 31, a second color filter 32 and a third color filter 32 on an inner surface 30A side of the second insulative substrate 30.

The second insulative substrate 30 is a transparent insulative substrate, which is formed of, for example, a material consisting mainly of polyimide (PI). The second insulative substrate 30 has a thickness of, e.g. 5 to 30 µm. As the material of the second insulative substrate 30, the same material as the first insulative substrate 10 is applicable. In particular, since light emitted from the top-emission type organic EL elements OLED1 to OLED3 passes through the second insulative substrate 30, it is desirable that the second insulative substrate 30 be formed of a material with high transparency (polyimide among the above-described materials).

The black matrix BM is formed on the inner surface 30A and is located above the ribs 15. The black matrix BM is formed, for example, in a grid shape or in a stripe shape. The first color filter 31 is a blue color filter which is opposed to the organic EL element OLED1 and passes a light component of a blue wavelength of white light. The second color filter 32 is a green color filter which is opposed to the organic EL element OLED2 and passes a light component of a green wavelength of white light. The third color filter 33 is a red color filter which is opposed to the organic EL element OLED3 and passes a light component of a red wavelength of white light. A boundary between the first color filter 31 and second color filter 32, a boundary between the second color filter 32 and third color filter 33 and a boundary between the first color filter 31 and third color filter 33 overlap the black matrix BK and are located above the ribs 15.

The array substrate AR and counter-substrate CT are attached by a transparent adhesive 40. Specifically, the adhesive 40 is interposed between the organic EL element OLED1 and first color filter 31, between the organic EL element OLED2 and second color filter 32 and between the organic EL element OLED3 and third color filter 33. In the example illustrated, the sealing film 50 is also interposed between the cathode CE and the adhesive 40.

According to the display device 1, when each of the organic EL elements OLED1 to OLED3 has emitted light, this radiated light (white light) is emitted to the outside via the first color filter 31, second color filter 32 or third color filter 33. At this time, a light component of a blue wavelength of the white light, which has been radiated from the organic EL element OLED1, passes through the first color filter 31. In addition, a light component of a green wavelength of the white light, which has been radiated from the organic EL element OLED2, passes through the second color filter 32. A light component of a red wavelength of the white light, which has been radiated from the organic EL element OLED3, passes through the third color filter 33. Thereby, color display is realized.

FIG. 1B is a view which schematically illustrates a cross-sectional structure including an extension part ARE of the display device 1 of the embodiment.

The extension part ARE corresponds to that part of the array substrate AR, which extends outward from a substrate end portion CTE of the counter-substrate CT. In the example illustrated, the extension part ARE is configured such that the first insulation film 11, second insulation film 12, third insulation film 13 and fourth insulation film 14 are stacked on the first insulative substrate 10 extending from the display element part 120, but the configuration of the extension part ARE is not limited to this example.

In the extension part ARE, a mounting portion 130 is formed. The mounting portion 130 is composed of, for example, terminals for mounting signal supply sources that supply signals, which are necessary for display, to the display element part 120. The signal supply sources, which are mounted on the mounting portion 130, include a driving IC chip, a flexible printed circuit board, etc. In the meantime, although not illustrated, various wirings, various circuits, etc., which are formed in the same layers as the gate electrode, source electrode, anode, etc., are formed in the extension part ARE. The respective terminals of the mounting portion 130 are electrically connected to these various wirings, various circuits, etc.

In the array substrate AR, the sealing film 50 covers the display element part 120, and exposes the extension part ARE. Specifically, the sealing film 50 does not cover the mounting portion 130. Thus, the sealing film 50 does not become an obstacle when the signal supply source is mounted on the mounting portion 130. Although the sealing film 50 is discontinuous in the vicinity of the substrate end portion CTE, an end face of the sealing film 50 is covered with an inorganic film which forms the sealing film 50. Specifically, even if the sealing film 50 is configured to include an organic film, the end face of the sealing film 50 is covered with the inorganic film, and the organic film is prevented from being exposed from the end face to outside air (or moisture contained in the outside air).

Although a detailed description of the counter-substrate CT is omitted, the inner surface 30A of the second insulative substrate 30 is covered with a peripheral light-shield layer SH. The peripheral light-shield layer SH is located at an outermost periphery of the display element part 120. The peripheral light-shield layer SH is formed integral with the black matrix BM, and is formed of the same material as the black matrix BM. The counter-substrate CT is attached to the array substrate AR by the adhesive 40.

FIG. 1C is a view which schematically illustrates another cross-sectional structure including the extension part ARE of the display device 1 of the embodiment.

The example illustrated in FIG. 1C differs from the example illustrated in FIG. 1B in that the peripheral light-shield layer SH covers not only the inner surface 30A but also an end face 30E of the second insulative substrate 30. The other structure is the same as in the example shown in FIG. 1B. The peripheral light-shield layer SH is formed integral with the black matrix BM, and is formed of the same material as the black matrix BM.

Next, a description is given of an example of a method of manufacturing the display device 1 according to the embodiment.

To begin with, as illustrated in FIG. 2, a first mother substrate M1 is prepared. Specifically, a film of a polyimide precursor compound with a thickness of 5 to 30 μm (e.g. 10 μm) is formed on a support substrate (glass substrate) 100 which is formed of no-alkali glass, by using a film-forming device such as a slit coater. Then, this film is cured by heat treatment, and a transparent peeling auxiliary layer 110 is formed. The peeling auxiliary layer 110 corresponds to the above-described first insulative substrate (resin substrate) 10. In the example illustrated, the peeling auxiliary layer 110 is continuously extends, without a break, over a first region A1, a second region A2 and a third region A3 on the support substrate 100.

Subsequently, a display element part 121 and an extension part ARE1 which are located in the first region A1 on the peeling auxiliary layer 110, a display element part 122 and an extension part ARE2 which are located in the second region A2 on the peeling auxiliary layer 110, and a display element part 123 and an extension part ARE3 which are located in the third region A3 on the peeling auxiliary layer 110, are formed. The first region A1 including the display element part 121 and extension part ARE1, the second region A2 including the display element part 122 and extension part ARE2, and the third region A3 including the display element part 123 and extension part ARE3, are adjacent to each other. However, it is desirable to secure margins at a time when the first mother substrate M1 is cut subsequently, and to provide gaps between the first region A1, second region A2 and third region A3.

The display element parts 121 to 123 have the same structure as the above-described display element part 120, and are composed of a plurality of organic EL elements which are arranged in a matrix. Besides, the extension parts ARE1 to ARE3 have the same structure as the above-described extension part ARE. In the example illustrated, the extension part ARE1 includes a mounting portion 131, the extension part ARE2 includes a mounting portion 132, and the extension part ARE3 includes a mounting portion 133.

The display element parts 121 to 123 are formed in the following manner. Specifically, the first insulation film 11 is formed on the peeling auxiliary layer 110, and the switching elements SW1 to SW3, second insulation film 12, third insulation film 13 and fourth insulation film 14 are formed on the first insulation film 11. At the same time, various wirings are formed. The wiring is formed by using a wiring material such as aluminum (Al), molybdenum (Mo), tungsten (Ta), copper (Cu) or titanium (Ti). Then, the organic EL elements OLED1 to OLED3 are formed on the fourth insulation film 14. Specifically, the anodes PE1 to PE3 are formed on the fourth insulation film 14, and then the ribs 15 are formed. Thereafter, the organic light emission layer ORG and cathode CE are successively formed. Then, the sealing film 50 is formed on the organic EL elements OLED1 to OLED3. Incidentally, the depiction of the detailed structure of each of the display element part 121 to 123 is omitted here.

Subsequently, as illustrated in FIG. 3 and FIG. 4, a second mother substrate M2 is prepared. Specifically, a film of a polyimide precursor compound with a thickness of 5 to 30 μm (e.g. 10 μm) is formed on an inner surface 200A of the support substrate (glass substrate) 200 which is formed of, e.g. no-alkali glass, by using a film-forming device such as a slit coater. Then, this film is cured by heat treatment and then patterned by using a photolithography process. Thereby, transparent peeling auxiliary layers 211 to 213 are formed. These peeling auxiliary layers 211 to 213 correspond to the above-described second insulative substrate (resin substrate) 30. The peeling auxiliary layer 211 is formed at such a position that the peeling auxiliary layer 211 is opposed to the display element part 121 of the first region A1 when the first mother substrate M1 and second mother substrate M2 are attached. Similarly, the peeling auxiliary layer 212 is formed at such a position that the peeling auxiliary layer 212 is opposed to the display element part 122 of the second region A2, and the peeling auxiliary layer 213 is formed at such a position that the peeling auxiliary layer 213 is opposed to the display element part 123 of the third region A3. These peeling auxiliary layers 211 to 213 are spaced apart from each other. Specifically, each of the peeling auxiliary layers 211 to 213 is formed in an island shape on the inner surface 200A of the support substrate 200. In other words, each of the peeling auxiliary layers 211 to 213 is patterned to have the same size as the second insulative substrate 30 of the organic EL display device that is a final product. In short, none of the peeling auxiliary layers extends at positions facing the extension parts ARE1 to ARE3.

A sacrifice layer 210 is formed on the inner surface 200A of the support substrate 200. Specifically, in the cross-sectional view shown in FIG. 3, the sacrifice layer 210 is located between the peeling auxiliary layer 211 and peeling auxiliary layer 212, between the peeling auxiliary layer 212 and peeling auxiliary layer 213, and between the peeling auxiliary layer 211 and peeling auxiliary layer 213. Specifically, the sacrifice layer 210 is formed at such positions that the sacrifice layer 210 is opposed to the extension parts ARE1 to ARE3 when the first mother substrate M1 and second mother substrate M2 are attached. In a plan view shown in FIG. 4, the sacrifice layer 210 is formed in a grid shape in a manner to surround the periphery of each of the peeling auxiliary layers 211 to 213. The sacrifice layer 210 corresponds to a color layer formed of a material which consists mainly of polyimide and in which a coloring material is dispersed.

Necessary characteristics for the coloring material, which is applicable to the sacrifice layer 210, are described. As will be described later, a laser beam is radiated when the peeling auxiliary layers 211 to 213 are to be peeled from the support substrate 200. Polyimide has such characteristics as to easily absorb energy of a radiated laser beam. A material having a higher energy absorption efficiency of the laser beam than the transparent peeling auxiliary layers 221 to 213 is selected for the coloring material included in the sacrifice layer 210. For example, the sacrifice layer 210 is a black resin layer. Specifically, the sacrifice layer 210 is formed of a black resin material which includes polyimide as a base material and in which a black coloring matter is dispersed.

The thickness of the sacrifice layer 210 is less than the thickness of the peeling auxiliary layers 211 to 213, and is about several μm. For example, the thickness of the sacrifice layer 210 is about 1 to 2 μm.

In the example illustrated in FIG. 3 and FIG. 4, almost the entirety of the inner surface 200A of the support substrate 200 is covered with the transparent peeling auxiliary layers 211 to 213 and the colored sacrifice layer 210. In the meantime, it should suffice if the sacrifice layer 210 is formed on at least that area of the array substrate AR, which is opposed to the extension parts ARE1 to ARE3. In addition, the sacrifice layer 210 may be formed before forming the peeling auxiliary layers 211 to 213, or after forming the peeling auxiliary layers 211 to 213.

Then, a color filter layer 221 which is located on the peeling auxiliary layer 211, a color filter layer 222 which is located on the peeling auxiliary layer 212, and a color filter layer 223 which is located on the peeling auxiliary layer 213, are formed. The color filer layers 221 to 223 have the same structure, and each of the color filer layers 221 to 223 includes the first color filter (blue color filter) 31, second color filter (green color filter) 32, third color filter (red color filter) 33, black matrix BM, and peripheral light-shield layer SH. The black matrix BM and peripheral light-shield layer SH are formed on the peeling auxiliary layers 211 to 213. In the case where the sacrifice layer 210 is formed after forming the peeling auxiliary layers 211 to 213, the sacrifice layer 210 can be formed of the same material, and at the same time, as the black matrix BM and peripheral light-shield layer SH. In the example illustrated, each of the first color filter 31, second color filter 32 and third color filter 33 is formed in a stripe shape, and the first color filter 31, second color filter 32 and third color filter 33 are cyclically arranged in the named order. The adhesive 40 is coated on the surfaces of the color filer layers 221 to 223.

In the meantime, the sacrifice layer 210 may be formed of a light-shielding metallic material such as aluminum (Al), chromium (Cr), molybdenum (Mo), or tungsten (W). By using this metallic material, the sacrifice layer 210 may be formed of the same material, and at the same time, as the black matrix BM and peripheral light-shield layer SH. Like the case in which the sacrifice layer 210 is formed of a color resin material, the sacrifice layer 210 may have such characteristics as to easily absorb energy of a radiated laser beam, or the sacrifice layer 210 may have such characteristics as to easily reflect the laser beam on its surface. When the sacrifice layer 210 is formed of the metallic material having such characteristics as to easily absorb energy, it is preferable that no thermal breakage occurs due to the absorption of energy.

It should suffice if the thickness of the sacrifice layer 210 is set at about such a value as to be able to sufficiently absorb energy of a laser beam or to be able to properly reflect the energy. For example, the thickness is about 50 nm to 500 nm, preferably about 100 nm to 200 nm.

Subsequently, as illustrated in FIG. 5, the first mother substrate M1 and second mother substrate M2 are attached. Incidentally, in FIG. 5 and following Figures, the depiction of the black matrix and peripheral light-shield layer is omitted, with respect to each of the color filter layers 221 to 223. The display element part 121 and color filter layer 221 are attached by the adhesive 40, the display element part 122 and color filter layer 222 are attached by the adhesive 40, and the display element part 123 and color filter layer 223 are attached by the adhesive 40. At this time, the extension parts ARE1 to ARE3 are opposed to the sacrifice layer 210.

Following the above, as illustrated in FIG. 6, as regards the second mother substrate M2, the support substrate 200 is peeled from the peeling auxiliary layers 211 to 213, and the support substrate 200 is removed. Specifically, as regards the second mother substrate M2, a laser beam is radiated on almost the entire surface of the support substrate 200 from the outer surface 200B side of the support substrate 200. At this time, as the light source of the laser beam that is radiated, use can be made of a light source (laser device) or a heat source (electromagnetic wave radiation device) which exhibits local energy absorption at an interface between the support substrate 200 and the peeling auxiliary layers 211 to 213. In this example, an excimer laser device, which is used in a step of fabricating a polysilicon of a TFT, was used.

By the radiation of the laser beam, the laser beam is blocked (or absorbed) at the sacrifice layer 210, while the laser beam is properly absorbed in the peeling auxiliary layers 211 to 213. The absorbed laser beam changes to thermal energy, and a part of the peeling auxiliary layers 211 to 213, for example, is evaporated in the vicinity of the interface between the peeling auxiliary layers 211 to 213 and the support substrate 200. Thus, the support substrate 200 and the peeling auxiliary layers 211 to 213 are separated. Thereby, the color filer layers 221 to 223, which are attached by the adhesive 40, and the peeling auxiliary layers 211 to 213 are transferred onto the first mother substrate M1. This method is generally called "laser ablation".

In the meantime, there may be a case in which the sacrifice layer 210 is separated from the peeling auxiliary layers 211 to 213 in the state in which the sacrifice layer 210 is attached to the inner surface 200A of the support substrate 200, as in the illustrated example, or a case in which the sacrifice layer 210 is evaporated and lost when the sacrifice layer 210 has absorbed the laser beam, or a case in which the sacrifice layer 210 is left on the first mother substrate M1 (on the mounting portion 130) together with the peeling auxiliary layers 211 to 213.

Figure 7:
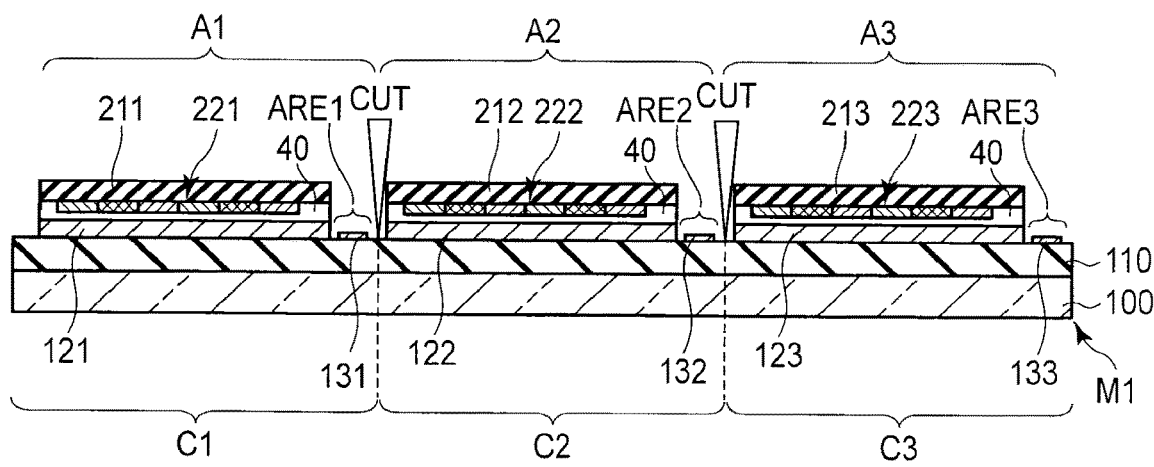
FIG. 7 is a view for describing the method of manufacturing the display device 1 of the embodiment, FIG. 7 illustrating a step of cutting the first mother substrate M1.

Then, as illustrated in FIG. 7, the first mother substrate M1 is cut. In the example illustrated, the first mother substrate M1 is cut between the first region A1 and second region A2 (more specifically, between the mounting portion 131 and the display element part 122) and between the second region A2 and third region A3 (more specifically, between the mounting portion 132 and the display element part 123). At this time, the support substrate 100 and peeling auxiliary layer 110 are cut batchwise. Such cutting of the first mother substrate M1 was carried out by, for example, laser beam irradiation from a CW (Continuous Wave) carbon dioxide laser.

Thereby, chips C1 to C3, which are separated, are obtained. The chip C1 includes the display element part 121, and the extension part ARE1 including the mounting portion 131. The chip C2 includes the display element part 122, and the extension part ARE2 including the mounting portion 132. The chip C3 includes the display element part 123, and the extension part ARE3 including the mounting portion 133.

Figure 8:
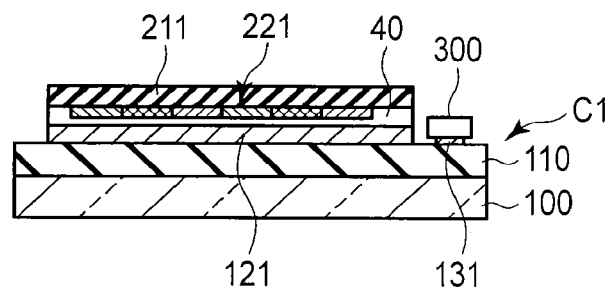
FIG. 8 is a view for describing the method of manufacturing the display device 1 of the embodiment, FIG. 8 illustrating a step of mounting a signal supply source 300 on a cut chip C1.

Subsequently, as illustrated in FIG. 8, as regards the separated chip C1, a signal supply source 300 is mounted on the mounting portion 131. At this time, since the support substrate 100 is left, it is possible to secure a support strength of the chip C1, against a pressing force which is applied at the time of mounting the signal supply source 300. Although not illustrated, signal supply sources are also mounted on the mounting portion 132 of the chip C2 and the mounting portion 133 of the chip C3.

Figure 9:
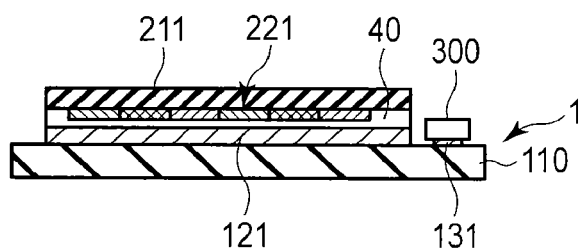
FIG. 9 is a view for describing the method of manufacturing the display device 1 of the embodiment, FIG. 9 illustrating a step of peeling a support substrate 100 of the first mother substrate M1.

Following the above, as illustrated in FIG. 9, as regards each chip, the support substrate 100 is peeled from the peeling auxiliary layer 110, and the support substrate 100 is removed. Although not described in detail, like the laser ablation illustrated in FIG. 6, a laser beam is radiated on the peeling auxiliary layer 110 from the outer surface side of the support substrate 100, thereby separating the support substrate 100 and the peeling auxiliary layer 110. At this time, an excimer laser device was used as the light source, like the case described with reference to FIG. 6.

Thereby, the display device 1 of the embodiment is manufactured.

According to the above-described embodiment, in the second mother substrate M2, each of the peeling auxiliary layers 211 to 213 is patterned in advance to have the same size as the second insulative substrate 30 of the organic EL display device that is the final product. After the second mother substrate M2, in which the color filter layers 221 to 223 are formed on the peeling auxiliary layers 211 to 213, and the first mother substrate M1, which has the TFT array structure, are attached, the support substrate 200 is peeled from the second mother substrate M2. Thereby, the step of cutting the second mother substrate M2 can be omitted. Thus, a cutting process at a position above the mounting portions 131 to 133 can be avoided.

In particular, when the peeling auxiliary layers 211 to 213 are formed, a photolithography technique, which is applicable to a color filter process or a TFT array process, is used. Thereby, the peeling auxiliary layers 211 to 213 can be patterned with fineness and precision that are several hundred times or more higher than in the case of a punching process by a Thomson blade.

In addition, since the first insulative substrate 10 is formed of a resin material such as polyimide with excellent heat resistance, it is possible to secure the precision in dimension of the TFT array (including various insulation films, switching elements and wirings) and organic EL elements which are formed on the first insulative substrate 10. Similarly, since the second insulative substrate 30 is formed of a resin material such as polyimide with excellent heat resistance, it is possible to secure the precision in dimension of the color filters, etc., which are formed on the second insulative substrate 30. Therefore, it is possible to suppress degradation in precision of attachment between the display element part and the color filter layer.

In particular, in the structure using the first insulative substrate 10 with a thickness of 5 to 30 μm, when the TFT array is fabricated, it is possible to utilize, with little alteration, the equipment which is used in the production line of active-matrix-type liquid crystal display panels. Therefore, it is possible to reduce the production cost, and it becomes easy to secure productivity, for example, by taking over the mass-production technology of liquid crystal display panels.

In addition, with the structure in which resin substrates are applied as the first insulative substrate 10 and second insulative substrate 30, compared to a display device using a glass substrate, the reduction in thickness and weight is possible, and flexibility is high and the degree of freedom in shaping is high. The resin substrate has a relatively high moisture-absorption property. However, even with the structure in which the resin substrate is applied as the first insulative substrate 10, the entrance of moisture via the first insulative substrate 10 can be suppressed since the inner surface 10A of the first insulative substrate 10 is covered with the first insulation film 11 that is the inner surface barrier film. In addition, since the organic EL elements OLED1 to OLED3 are sealed by the transparent sealing film 50, the entrance of moisture from the second insulative substrate 30 side can be suppressed. Thereby, deterioration due to moisture of the organic light emission layer ORG can be suppressed, and degradation in display quality due to occurrence of dark spots can be suppressed.

Besides, according to the embodiment, in the second mother board M2, while the peeling auxiliary layers 211 to 213 are divided in advance to as to face the display element parts 121 to 123, the sacrifice layer 210 is disposed at positions facing the extension parts ARE1 to ARE3. Thus, the laser beam, which is radiated on the second mother board M2 when the support substrate 200 is peeled from the peeling auxiliary layers 211 to 213, is properly absorbed by the peeling auxiliary layers 211 to 213, and the peeling auxiliary layers 211 to 213 are separated from the support substrate 200. On the other hand, the laser beam is blocked (or absorbed) by the sacrifice layer 210. Thereby, the laser beam is suppressed from reaching the extension parts ARE1 to ARE3 which are opposed to the sacrifice layer 210. It is thus possible to suppress damage to the extension parts ARE1 to ARE3 by the laser beam for peeling the support device 200 (e.g. breakage of wirings or circuits, starting from ablation of the first insulative substrate 10 that is formed of the resin substrate of, e.g. polyimide, which easily absorbs the laser beam).

Accordingly, the productivity of the display device, which can be reduced in thickness and weight, can be improved by the simple method.

In the meantime, even if the sacrifice layer 210 is left on the first mother board M1, the sacrifice layer 210 is very thin, compared to the peeling auxiliary layers 211 to 213. Thus, the sacrifice layer 210 can easily be removed in a fabrication process, or may be removed by dry etching. For example, in the structure in which the array substrate AR includes the sealing film 50, if an inorganic film of the sealing film 50 is configured to extend not only in the display element part but also in the extension part, dry etching is performed for exposing the terminal of the mounting portion, before mounting the signal supply source on the mounting portion. The dry etching is performed under such a condition that the second insulative substrate or the peeling auxiliary layers 211 to 213 may not excessively removed. Thereby, the sacrifice layer 210 can be removed and the inorganic film covering the mounting portion can also be removed.

Next, another method of manufacturing the display device 1 in the embodiment is briefly described. A description of parts common to the above-described manufacturing method is omitted.

Figure 10:
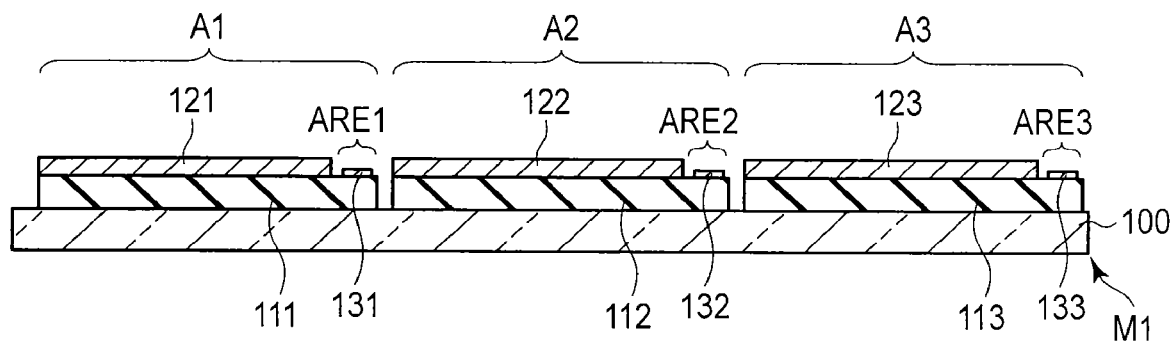
FIG. 10 is a view for describing another method of manufacturing the display device 1 of the embodiment, FIG. 10 illustrating a step of preparing a first mother substrate M1.

To begin with, as illustrated in FIG. 10, a first mother substrate M1 is prepared. Specifically, peeling auxiliary layers 111 to 113 are formed on a support substrate (glass substrate) 100. The method of forming the peeling auxiliary layers 111 to 113 is the same as the method of forming the peeling auxiliary layers 211 to 213. For example, after a film of a material consisting mainly of polyimide is formed, patterning is performed by using a photolithography process. Thereby, the peeling auxiliary layers 111 to 113 are formed. The peeling auxiliary layers 111 to 113 correspond to the above-described first insulative substrate (resin substrate) 10. The peeling auxiliary layers 111 to 113 are formed in the first region A1, second region A2 and third region A3, and are spaced apart from each other. Specifically, each of the peeling auxiliary layers 111 to 113 is formed in an island shape on the support substrate 100. In other words, each of the peeling auxiliary layers 111 to 113 is patterned to have the same size as the first insulative substrate 10 of the organic EL display device that is a final product.

Subsequently, a display element part 121 and an extension part ARE1 are formed on the peeling auxiliary layer 111, a display element part 122 and an extension part ARE2 are formed on the peeling auxiliary layer 112, and a display element part 123 and an extension part ARE3 are formed on the peeling auxiliary layer 113. Each of the display element parts 121 to 123 has the same structure as the above-described display element part 120, and a description thereof is omitted. The extension part ARE1 includes a mounting portion 131, the extension part ARE2 includes a mounting portion 132, and the extension part ARE3 includes a mounting portion 133.

On the other hand, a second mother substrate M2 having the same structure as shown in FIG. 3 and FIG. 4 is prepared.

Figure 11:
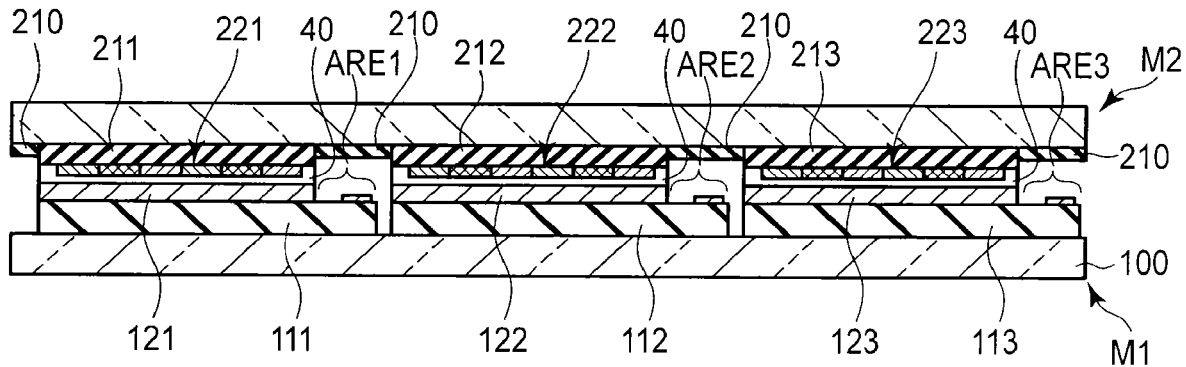
FIG. 11 is a view for describing the another method of manufacturing the display device 1 of the embodiment, FIG. 11 illustrating a step of attaching the first mother substrate M1 and a second mother substrate M2.

Subsequently, as illustrated in FIG. 11, the first mother substrate M1 and second mother substrate M2 are attached. Specifically, the display element part 121 and color filter layer 221 are attached by an adhesive 40, the display element part 122 and color filter layer 222 are attached by the adhesive 40, and the display element part 123 and color filter layer 223 are attached by the adhesive 40. At this time, the extension parts ARE1 to ARE3 are opposed to the sacrifice layer 210.

Figure 12:
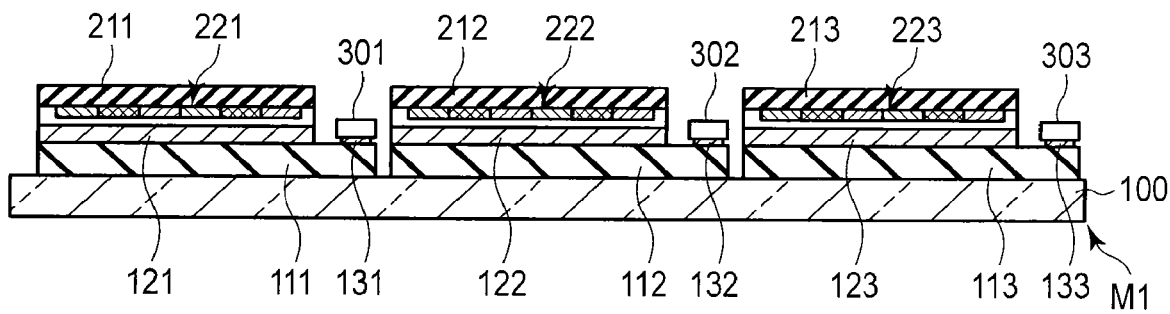
FIG. 12 is a view for describing the another method of manufacturing the display device 1 of the embodiment, FIG. 12 illustrating a step of peeling a support substrate 200 of the second mother substrate M2.

Thereafter, as illustrated in FIG. 12, as regards the second mother substrate M2, the support substrate 200 is peeled from the peeling auxiliary layers 211 to 213, and the support substrate 200 is removed, by using, for example, the laser ablation technique illustrated in FIG. 6. Then, a signal supply source 301 is mounted on the mounting portion 131, a signal supply source 302 is mounted on the mounting portion 132, and a signal supply source 303 is mounted on the mounting portion 133.

Figure 13:
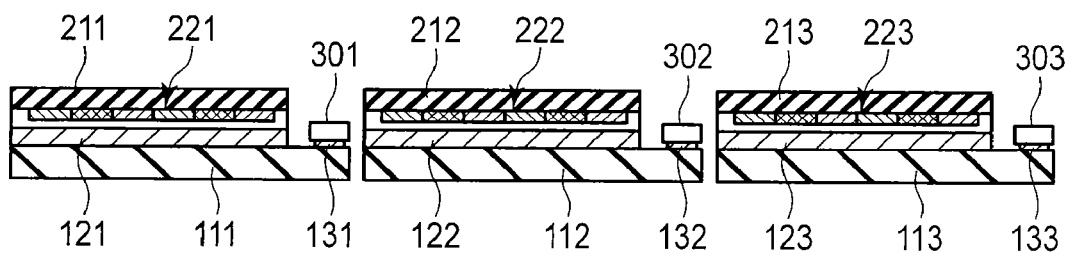
FIG. 13 is a view for describing the another method of manufacturing the display device 1 of the embodiment, FIG. 13 illustrating a step of peeling a support substrate 100 of the first mother substrate M1.

Following the above, as illustrated in FIG. 13, as regards the first mother substrate M1, the support substrate 100 is peeled from the peeling auxiliary layers 111 to 113, and the support substrate 100 is removed, by using, for example, the laser ablation technique illustrated in FIG. 6. Specifically, a laser beam is radiated on the peeling auxiliary layers 111 to 113 from the outer surface side of the support substrate 100, thereby separating the support substrate 100 and the peeling auxiliary layers 111 to 113.

Thereby, the display device 1 of the embodiment is manufactured.

In this manufacturing method, compared to the above-described manufacturing method, the step of cutting the first mother substrate M1 is needless. Thus, the productivity can further be improved.

Next, another method of manufacturing the display device 1 in the embodiment is briefly described. A description of parts common to the above-described manufacturing method is omitted. The manufacturing method to be described below is an example of a method of manufacturing the display device 1 having the cross-sectional structure shown in FIG. 1C.

To begin with, a first mother substrate M1 having the same structure as shown in FIG. 2 is prepared. The description below relates to a case in which the structure shown in FIG. 2 is applied to the first mother substrate M1. However, a first mother substrate M1 having the same structure as shown in FIG. 10 may be prepared.

On the other hand, as illustrated in FIG. 14, a second mother substrate M2 is prepared. Specifically, after peeling auxiliary layers 211 to 213 are formed on the inner surface 200A of the support substrate 200, a sacrifice layer 210 and a peripheral light-shield layer SH are formed. The sacrifice layer 210 and peripheral light-shield layer SH can be formed of the same material, and at the same time, as the black matrix BM. The sacrifice layer 210 is formed on the inner surface 200A of the support substrate 200, and is located between the peeling auxiliary layer 211 and peeling auxiliary layer 212, between the peeling auxiliary layer 212 and peeling auxiliary layer 213, and between the peeling auxiliary layer 211 and peeling auxiliary layer 213. The peripheral light-shield layer SH is formed in a manner to cover an end face 211E of the peeling auxiliary layer 211, an end face 212E of the peeling auxiliary layer 212, and an end face 213E of the peeling auxiliary layer 213. The peripheral light-shield layer SH is continuous with the sacrifice layer 210. The color filter layers 221 to 223 have the same structure as in the example shown in FIG. 3.

Subsequently, in the same manner as illustrated in FIG. 5, the first mother substrate M1 and second mother substrate M2 are attached.

Thereafter, as illustrated in FIG. 15, as regards the second mother substrate M2, the support substrate 200 is peeled from the peeling auxiliary layers 211 to 213, and the support substrate 200 is removed. Specifically, as regards the second mother substrate M2, a laser beam is radiated on almost the entire surface of the support substrate 200 from the outer surface 200B side of the support substrate 200. By the radiation of the laser beam, the support substrate 200 and the peeling auxiliary layers 211 to 213 are separated.

In the meantime, as in the example illustrated, the sacrifice layer 210 is separated from the peeling auxiliary layers 211 to 213 and peripheral light-shield layer SH in the state in which the sacrifice layer 210 is attached to the inner surface 200A of the support substrate 200, and the sacrifice layer 210 is removed together with the support substrate 200.

Subsequently, through the same fabrication steps as illustrated in FIG. 7 to FIG. 9, or through the same fabrication steps as illustrated in FIG. 12 and FIG. 13, the display device 1 of the embodiment is manufactured.

According to this manufacturing method, at a time of patterning for integrally forming the sacrifice layer 210 and peripheral light-shield layer SH, even if misalignment occurs between the sacrifice layer 210 and peripheral light-shield layer SH, on one hand, and the peeling auxiliary layers 211 to 213, on the other hand, it is possible to prevent a gap from occurring between the peeling auxiliary layers 211 to 213 and the sacrifice layer 210.

If a gap occurs between the peeling auxiliary layers 211 to 213 and the sacrifice layer 210, a laser beam, which is radiated when the support substrate 200 is peeled, passes through the gap and directly falls on the first mother substrate M1, and may possibly damage wiring layers, etc., which are formed on the first mother substrate M1. By contrast, when the above-described manufacturing method is applied, formation of a gap can be prevented without adding another fabrication step. Thus, the laser beam at the time of peeling the support substrate 200 can be surely shielded, and the wiring layers, etc. of the first mother substrate M1 can be protected from the laser beam.

In addition, by forming the sacrifice layer 210, which is formed integral with the peripheral light-shield layer SH, with the above-described proper thickness, the peripheral light-shield layer SH, which covers the end face of the peeling auxiliary layer, and the sacrifice layer 210, which covers the inner surface 200A of the support substrate 200, are cut apart by the peeling force between the support substrate 200 and the peeling auxiliary layers 211 to 213. Thus, there is no need to add a fabrication step of separating the peripheral light-shield layer SH and the sacrifice layer 210.

As has been described above, according to the present embodiment, a method of manufacturing a display device, which can improve productivity, can be provided.

In the above-described embodiment, as an example of the display device, the organic EL display device has been described. However, another example of the display device may be a liquid crystal display device. In this case, the display element part is configured to include a pixel electrode in place of the anode, which is connected to a switching element, a common electrode in place of the cathode, and a liquid crystal layer including liquid crystal molecules in place of the organic light emission layer. Light, which passes through the liquid crystal layer, is modulated by switching the liquid crystal molecules by an electric field between the pixel electrode and counter-electrode. Use may be made of a method in which a closed-loop-shaped sealant is used in place of the adhesive 40, and a liquid crystal material is dispensed in the inside surrounded by the sealant before the first mother substrate M1 and second mother substrate M2 are attached.

In the embodiment, the above-described laser ablation technique is applied to the peeling between the support substrate 100 and the auxiliary layer 110, the peeling between the support substrate 100 and the peeling auxiliary layers 111 to 113, and the peeling between the support substrate 200 and the peeling auxiliary layers 211 to 213. Alternatively, other techniques, such as a thermal rapid anneal technique, are applicable.

In the embodiment, the sacrifice layer 210 is formed of a material with good light absorption properties for a laser beam for peeling of the support substrate 200, for example, the same material as the material of the black matrix BM. However, the embodiment is not limited to this example, and the sacrifice layer 210 may be formed of the same material, and at the same time, as the first color filter 31, second color filter 32 and third color filter 33. In addition, the material of the sacrifice layer 210 is not limited to the material consisting mainly of polyimide. The sacrifice layer 210 may be formed of a material consisting mainly of polyamide-imide or polyaramide.

When the sacrifice layer 210 and peripheral light-shield layer SH are formed integral, the sacrifice layer 210 and peripheral light-shield layer SH may be formed of the same material, and at the same time, as the black matrix BM, or may be formed in a fabrication step different from the fabrication step of the black matrix BM. When the sacrifice layer 210 and peripheral light-shield layer SH are formed in a fabrication step different from the fabrication step of the black matrix BM, the sacrifice layer 210 and peripheral light-shield layer SH may be formed before forming the first to third color filters 31 to 33, or may be formed after forming the first to third color filters 31 to 33.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit

What is claimed is:

1. A method of manufacturing a display device, comprising:
   preparing a first substrate,
   the preparing the first substrate comprising:
   forming a first peeling auxiliary layer on a first support substrate, forming a first display element part including a first display element and a first extension part including a first mounting portion, the first display element part and the first extension part being located in a first region above the first peeling auxiliary layer, and
   forming a second display element part including a second display element and a second extension part including a second mounting portion, the second display element part and the second extension part being located in a second region adjacent to the first region above the first peeling auxiliary layer;
   preparing a second substrate, the preparing the second substrate comprising:
   forming a second peeling auxiliary layer and a third peeling auxiliary layer spaced apart from each other on a second support substrate, and
   forming a sacrifice layer in contact with and covering the second support substrate between the second peeling auxiliary layer and the third peeling auxiliary layer;
   attaching the first substrate and the second substrate to each other in a state in which the second peeling auxiliary layer and the first display element part are opposed to each other,
   the third peeling auxiliary layer and the second display element part are opposed to each other, and the sacrifice layer and the first extension part are opposed to each other;
   peeling the second support substrate from the second peeling auxiliary layer and the third peeling auxiliary layer after attaching the first substrate and the second substrate to each other;
   cutting the first substrate between the first region and the second region while leaving the first peeling auxiliary layer;
   mounting a signal supply source on the first mounting portion; and peeling the first support substrate from the first peeling auxiliary layer.

2. The method of claim 1, wherein
   the first peeling auxiliary layer is formed of a material containing polyimide as a major component.

3. The method of claim 1, wherein
   the peeling the first support substrate from the first peeling auxiliary layer is executed by radiating a laser beam.

4. The method of claim 1, wherein
   the first display element part comprises an organic EL element.

* * * * *